(12) United States Patent
Ro et al.

(10) Patent No.: US 8,951,891 B2
(45) Date of Patent: Feb. 10, 2015

(54) DEPOSITION SUBSTRATE OF DEPOSITION APPARATUS, METHOD OF FORMING LAYER USING THE SAME, AND METHOD OF MANUFACTURING ORGANIC LIGHT EMITTING DIODE DISPLAY DEVICE

(75) Inventors: Jae-Sang Ro, Seoul (KR); Won-Eui Hong, Seoul (KR)

(73) Assignee: Ensil Tech Corporation (KR)

( * ) Notice: Subject to any disclaimer, the term of this patent is extended or adjusted under 35 U.S.C. 154(b) by 529 days.

(21) Appl. No.: 13/988,875

(22) PCT Filed: Jul. 7, 2010

(86) PCT No.: PCT/KR2010/004411
§ 371 (c)(1),
(2), (4) Date: May 22, 2013

(87) PCT Pub. No.: WO2011/005021
PCT Pub. Date: Jan. 13, 2011

(65) Prior Publication Data
US 2013/0267055 A1     Oct. 10, 2013

(30) Foreign Application Priority Data
Jul. 10, 2009 (KR) .................. 10-2009-0063135

(51) Int. Cl.
*H01L 23/34* (2006.01)
*H01L 51/56* (2006.01)
(Continued)

(52) U.S. Cl.
CPC ............ *H01L 51/0002* (2013.01); *C23C 14/04* (2013.01); *C23C 14/26* (2013.01); *H01L 51/0013* (2013.01); *B32B 3/266* (2013.01);
(Continued)

(58) Field of Classification Search
CPC ...................................................... H01L 23/345
See application file for complete search history.

(56) References Cited

U.S. PATENT DOCUMENTS

| 2008/0226814 | A1 | 9/2008 | Kawamura et al. | |
|---|---|---|---|---|
| 2009/0038550 | A1* | 2/2009 | Higo | 118/726 |
| 2009/0166563 | A1* | 7/2009 | Yokoyama et al. | 250/492.1 |

FOREIGN PATENT DOCUMENTS

| JP | 2001295027 | 10/2001 |
|---|---|---|
| JP | 2002302759 | 10/2002 |

(Continued)

OTHER PUBLICATIONS

International Search Report—PCT/KR2010/004411 dated Feb. 23, 2011.
(Continued)

*Primary Examiner* — Steven W Smoot
(74) *Attorney, Agent, or Firm* — Cantor Colburn LLP

(57) ABSTRACT

Provided are a deposition substrate of a deposition apparatus, a method of forming a layer using the same, and a method of manufacturing an organic light emitting diode (OLED) display device. The method of forming a layer using the deposition substrate includes preparing a substrate, forming a heating conductive layer for Joule heating on the substrate, forming a first insulating layer on the heating conductive layer for Joule heating and including a groove or hole, forming a deposition material layer on a top surface of the first insulating layer having the groove or hole, and applying an electric field to the heating conductive layer for Joule heating to perform Joule-heating on the deposition material layer. Thus, the method is suitable for manufacturing a large-sized device.

29 Claims, 7 Drawing Sheets

(51) Int. Cl.
H01L 51/00 (2006.01)
C23C 14/04 (2006.01)
C23C 14/26 (2006.01)
B32B 3/26 (2006.01)
B32B 3/30 (2006.01)
H01L 51/50 (2006.01)

(52) U.S. Cl.
CPC ............... *B32B 3/30* (2013.01); *H01L 51/5012* (2013.01); *H01L 51/5048* (2013.01)
USPC .......................................................... 438/466

(56) References Cited

FOREIGN PATENT DOCUMENTS

JP 2006202510 8/2006
JP 2008174783 7/2008

OTHER PUBLICATIONS

Korean Office Action—Korean Application No. 10-2009-0063135 issued on Jan. 24, 2011, citing JP2006-202510 and JP2002-302759.
Korean Notice of Allowance—Korean Application No. 10-2009-0063135 issued on Apr. 26, 2012, citing JP2006202510, JP2002302759, JP2008174783 and JP2001295027.

\* cited by examiner

DEPOSITION SUBSTRATE OF DEPOSITION APPARATUS, METHOD OF FORMING LAYER USING THE SAME, AND METHOD OF MANUFACTURING ORGANIC LIGHT EMITTING DIODE DISPLAY DEVICE

TECHNICAL FIELD

The present invention relates to a method of forming a layer using a deposition substrate of a deposition apparatus, and more particularly, to a method of forming a layer to deposit a predetermined layer by Joule heating by applying an electric field to a conductive layer.

BACKGROUND ART

Among flat panel display devices, an organic light emitting diode (OLED) display device has an advantage as a moving picture display medium regardless of the size of the device due to a high response time of 1 ms or less, low power consumption, a self emission characteristic, and a wide viewing angle. The OLED display device has also attracted attention as a next-generation flat panel display device because it can be manufactured at a low temperature by a simple process based on conventional semiconductor process technology.

Methods of forming a thin film of the flat panel display device or OLED display device are roughly classified into methods for a polymer device using a wet process and methods for a small molecular device using a deposition process according to the material and process to be used.

For example, an inkjet printing method among the methods of forming a polymer or small-molecular emitting layer has disadvantages in that materials suitable for forming organic layers other than the emitting layer are limited, and a structure for inkjet printing should be formed on a substrate.

When an emitting layer is formed by deposition, a separate metal mask is used. The size of the flat panel display device is directly proportional to the size of the metal mask. As the metal mask is increased in size, it is difficult to manufacture a large-sized device due to sagging of the metal mask.

FIG. 1 is a schematic cross-sectional view of a deposition apparatus including a deposition mask.

Referring to FIG. 1, to deposit a thin film of an OLED display device, for example, an organic layer including an emitting layer, using a mask 1, a frame 4 coupled to the mask is equipped at a location corresponding to a thin film deposition crucible 3 installed in a vacuum chamber 2, and a subject 5 on which a thin film will be formed is installed. A magnet unit 6 is operated so that the mask 1 supported by the frame 4 is closely in contact with the subject 5 on which the thin film will be formed. In this state, a material disposed in the thin film deposition crucible 3 during the operation of the thin film deposition crucible 3 is deposited on the subject 5.

However, as described above, in the formation of a thin film using a deposition apparatus having such a deposition mask, as a flat panel display device becomes larger, the deposition mask needs to be also increased in size. In this case, however, due to the sagging of the mask, alignment between the mask and the subject is difficult, and thus a large-sized device is also difficult to be manufactured.

DISCLOSURE

Technical Problem

The present invention is directed to providing a method of forming a layer suitable for manufacturing a large-sized device.

Technical Solution

One aspect of the present invention provides a deposition substrate of a deposition apparatus, including: a substrate; a heating conductive layer for Joule heating formed on the substrate; a first insulating layer formed on the heating conductive layer for Joule heating and including a groove or hole; and a deposition material layer formed on a top surface of the first insulating layer having the groove or hole.

The groove or hole may be formed to correspond to the shape of a layer formed by the deposition apparatus.

The deposition substrate of the deposition apparatus may further include a second insulating layer formed on the first insulating layer having the hole and including a concave.

The concave may be formed to correspond to the shape of a layer formed by the deposition apparatus.

Another aspect of the present invention provides a method of forming a layer, including: preparing a substrate; forming a heating conductive layer for Joule heating on the substrate; forming a first insulating layer on the heating conductive layer for Joule heating and including a groove or hole; forming a deposition material layer on a top surface of the first insulating layer having the groove or hole; and applying an electric field to the heating conductive layer for Joule heating to perform Joule heating on the deposition material layer.

The groove or hole may be formed to correspond to the shape of a layer formed by the deposition apparatus.

The deposition material layer subjected to the Joule heating may be the deposition material layer in a region corresponding to the groove or hole.

A deposition material of the deposition material layer in the region corresponding to the groove or hole may be evaporated.

A second insulating layer having a concave may be further formed on the first insulating layer having the hole.

The concave may be formed to correspond to the shape of a layer formed by the deposition apparatus.

Still another aspect of the present invention provides a method of manufacturing an organic light emitting diode (OLED) display device, including: preparing a first substrate; forming a first electrode layer on a top surface of the first substrate; forming a pixel defining layer on a top surface of the first electrode layer; forming an opening partially exposing the first electrode layer on the pixel defining layer; forming an organic layer including an emitting layer on a top surface of the first electrode layer; and forming a second electrode layer on a top surface of the organic layer. Here, at least one layer of the OLED display device is formed by: preparing a second substrate corresponding to the first substrate; forming a first heating conductive layer for Joule heating on the second substrate; forming a first insulating layer having a groove or hole on the first heating conductive layer for Joule heating; forming a first deposition material layer on a top surface of the first insulating layer having the groove or hole; and applying an electric field to the first heating conductive layer for Joule heating to perform Joule heating on the first deposition material layer.

The method may further include forming a thin film transistor including: a semiconductor layer including a channel region and source and drain regions on the first substrate; a gate electrode corresponding to the channel region of the semiconductor layer; and source and drain electrodes in electrical connection with the semiconductor layer. The gate electrode or the source or drain electrode of the thin film transistor is formed by: preparing a third substrate corresponding to the first substrate; forming a second heating conductive layer for Joule heating on the third substrate; forming a second insulating layer having a groove or hole on the second heating conductive layer for Joule heating; forming a second deposition material layer on a top surface of the second insulating layer having the groove or hole; and applying an electric field to the second heating conductive layer for Joule heating to perform Joule heating on the second deposition material layer.

The deposition material layer subjected to the Joule heating may be the deposition material layer in a region corresponding to the groove or hole.

A deposition material of the deposition material layer in the region corresponding to the groove or hole may be evaporated.

The method may further include forming a third insulating layer having a concave on the first insulating layer having the hole.

The concave may be formed to correspond to the shape of a layer formed by the deposition apparatus.

Advantageous Effects

According to the present invention, a method of forming a layer suitable for manufacturing a large-sized device is provided.

According to the present invention, a patterning method of forming a layer during the manufacture of a device without photolithography or a separate shadow mask is provided.

Compared to a conventional layer forming method, the present method can form a layer for a very short time.

| * Description of Major Symbols | |
|---|---|
| 100, 300: substrate | |
| 110: heating conductive layer for Joule heating | |
| 140: deposition material layer | |
| 150, 200: device substrate | 210: buffer layer |
| 220a: source region | 220b: drain region |
| 221: channel region | 230: gate insulting layer |
| 231: gate electrode | 240: interlayer insulating layer |
| 150a: source electrode | 150b: drain electrode |
| 260: inorganic layer | 270: organic layer |

-continued

| * Description of Major Symbols | |
|---|---|
| 280: first electrode layer | 281: pixel defining layer |
| 291: organic layer | 292: second electrode |

MODE FOR INVENTION

Hereinafter, exemplary embodiments of the present invention will be described in detail. However, the present invention is not limited to the exemplary embodiments disclosed below, but can be implemented in various types. Therefore, the present exemplary embodiments are provided for complete disclosure of the present invention and to fully inform the scope of the present invention to those ordinarily skilled in the art.

Figure 1:
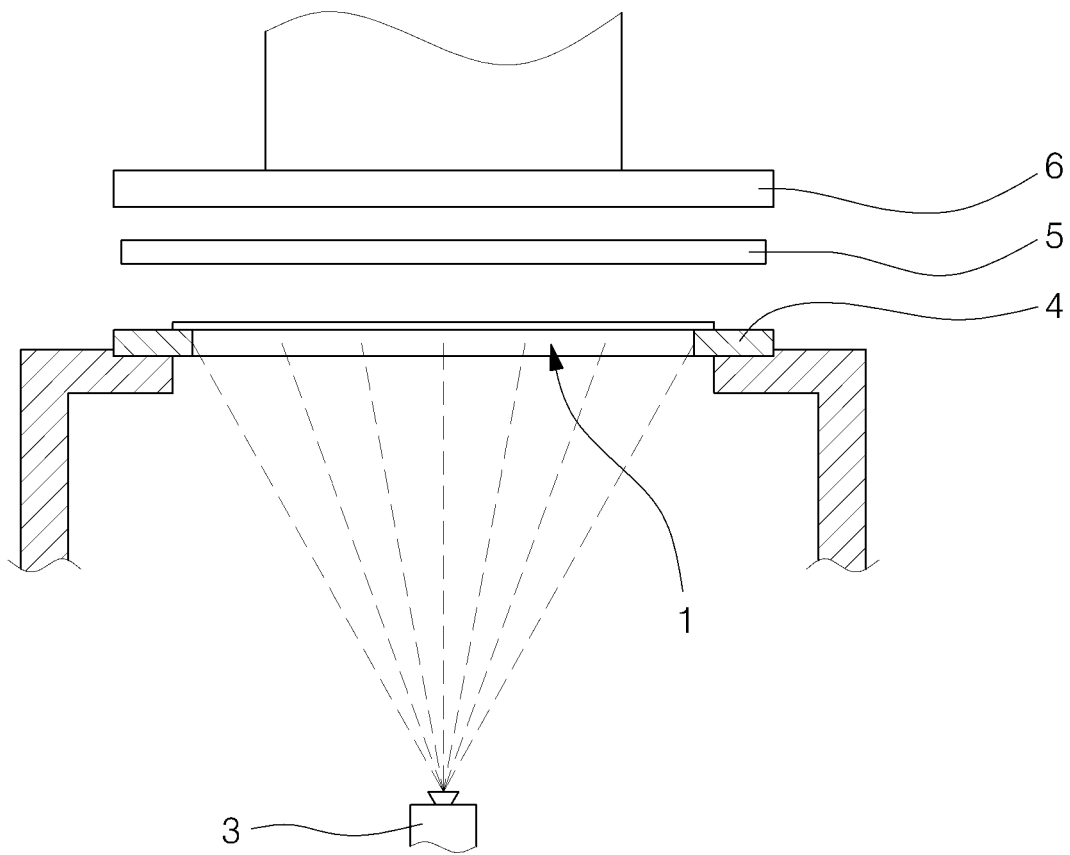
FIG. 1 is a schematic cross-sectional view of a deposition apparatus including a deposition mask.
Figure 2:
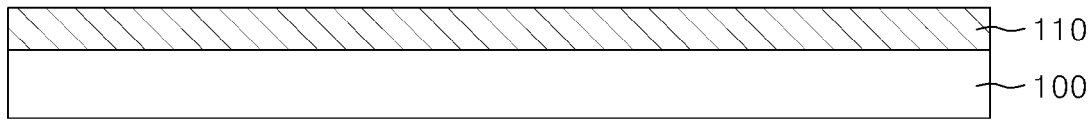
FIGS. 2 to 4 are schematic cross-sectional views of a deposition substrate of a deposition apparatus according to a first exemplary embodiment of the present invention.
Figure 3:
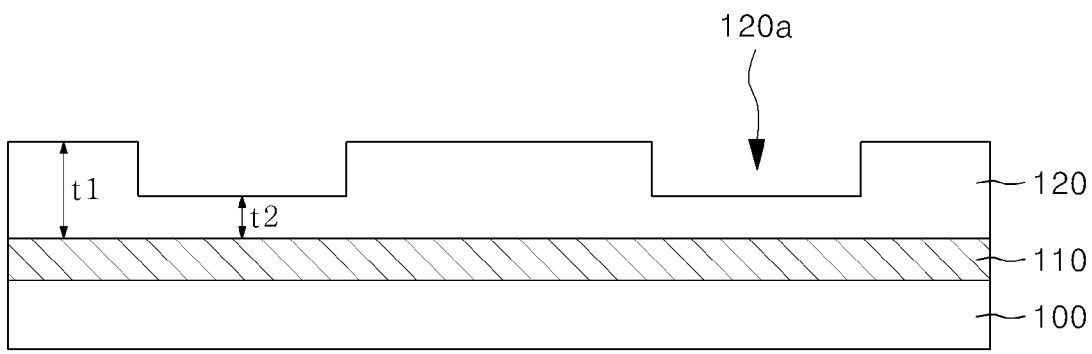
Figure 4:
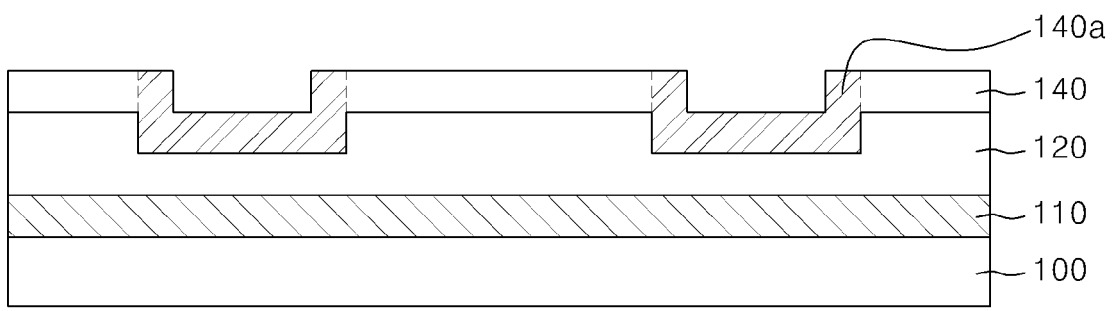

FIGS. 2 to 4 are schematic cross-sectional views of a deposition substrate of a deposition apparatus according to a first exemplary embodiment of the present invention. Here, for clarity, in the accompanying drawings, a configuration of the deposition substrate is merely illustrated, and the deposition substrate may be disposed in a vacuum chamber.

First, referring to FIG. 2, a heating conductive layer 110 for Joule heating is formed on a substrate 100 using, for example, glass, ceramic or plastic.

The heating conductive layer 110 for Joule heating generates Joule heat by applying an electric field to an electrode so as to evaporate a deposition material by the resultant Joule heat, which will be described in detail below.

Forming the heating conductive layer 110 for Joule heating on the substrate 100 may be carried out by any method of forming a layer known in the art, for example, but is not limited to, low-pressure chemical vapor deposition (LPCVD), atmospheric pressure chemical vapor deposition (APCVD), plasma enhanced chemical vapor deposition (PECVD), sputtering, or vacuum evaporation.

The heating conductive layer 110 for Joule heating may be formed of a metal or metal alloy. The metal or metal alloy may include, but is not limited to, molybdenum (Mo), titanium (Ti), chromium (Cr) or molybdenum-tungsten (MoW).

Subsequently, referring to FIG. 3, according to the known layer forming method as described above, an insulating layer 120 is formed on the heating conductive layer 110 for Joule heating, and a groove 120a is formed in the insulating layer 120 by removing a predetermined region of the insulating layer 120.

The insulating layer 120 may be an organic or inorganic layer. The organic layer may be formed of, but is not limited to, one selected from the group consisting of polyacrylates resin, epoxy resin, phenolic resin, polyamides resin, polyimides resin, unsaturated polyesters resin, poly(phenylene ethers) resin, poly(phenylene sulfides) resin and benzocyclobutene (BCB), and the inorganic layer may be formed of a silicon oxide layer, a silicon nitride layer, or a silicon oxynitride layer.

The formation of the groove 120a in the insulating layer 120 by removing a predetermined region of the insulating layer 120 may be carried out through, but is not limited to, photolithography and etching processes known in the art.

The insulating layer 120, as shown in FIG. 3, is formed to a thickness of t1, and formed to a thickness of t2 in the region in which the groove 120a is formed, which will be described below.

Here, in the present invention, the groove 120a in the insulating layer 120 is formed to correspond to the shape of a predetermined layer formed by the deposition apparatus according to the present invention.

For example, provided that a gate electrode is formed using the deposition apparatus according to the present invention, the groove 120a is formed to correspond to the shape of the gate electrode, or provided that an organic layer is formed using the deposition apparatus according to the present invention, the groove 120a is formed to correspond to the shape of the organic layer.

Here, the shape of the predetermined layer may indicate a plan structure of the predetermined layer.

Referring to FIG. 4, a deposition material layer 140 is formed on the insulating layer 120 having the groove 120a.

The deposition material layer 140 may be formed by any method known in the art, for example, but is not limited to, LPCVD, APCVD, PECVD, sputtering or vacuum evaporation.

The deposition material layer 140 is formed of a material for a predetermined layer formed by the deposition apparatus according to the present invention. For example, provided that a gate electrode is formed using the deposition apparatus according to the present invention, the deposition material layer 140 may be formed of a material for the gate electrode, or provided that an organic layer is formed using the deposition apparatus according to the present invention, the deposition material layer 140 is formed of a material for the organic layer.

That is, the material for the deposition material layer 140 is changed according to a subject on which a layer is formed using the deposition apparatus according to the present invention, and the deposition material layer 140 may be an organic, inorganic or metal layer.

Figure 5:
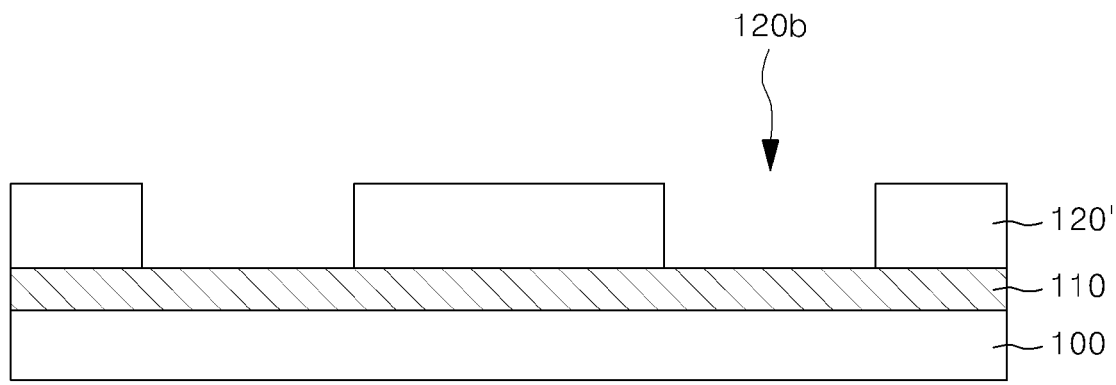
FIGS. 5 to 7 are schematic cross-sectional views of a deposition substrate of a deposition apparatus according to a second exemplary embodiment of the present invention.
Figure 6:
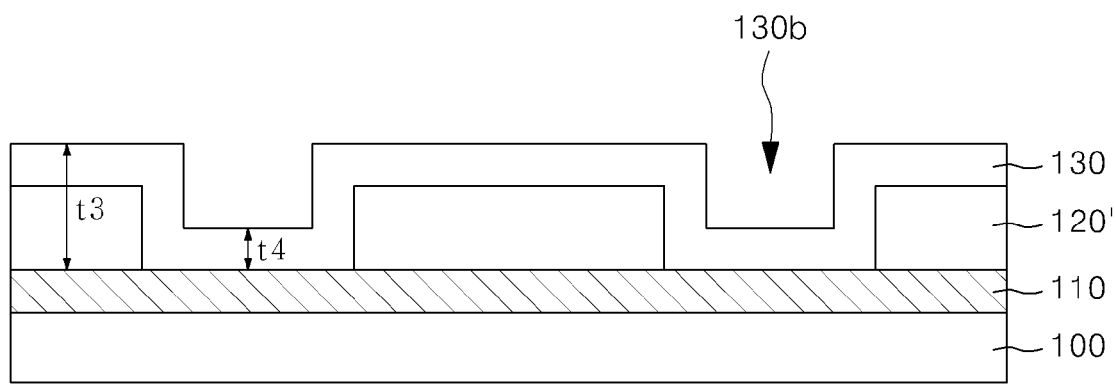
Figure 7:
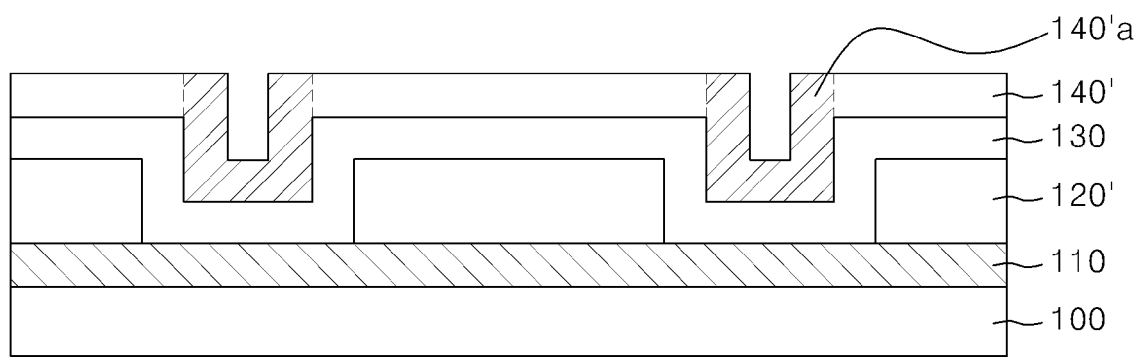

FIGS. 5 to 7 are schematic cross-sectional views of a deposition substrate of a deposition apparatus according to a second exemplary embodiment of the present invention. The deposition substrate according to the second exemplary embodiment of the present invention may be the same as that according to the first exemplary embodiment, except as described below. Further, for clarity, the accompanying drawings merely illustrate a configuration of the deposition substrate, and the deposition substrate may be disposed in a vacuum chamber.

First, referring to FIG. 5, a heating conductive layer 110 for Joule heating is formed on a substrate 100 formed of glass, stainless steel or plastic, and a first insulating layer 120' is formed on the heating conductive layer 110 for Joule heating by the known layer forming method described above.

Here, a hole 120b is formed in the first insulating layer 120' by removing a predetermined region of the first insulating layer 120'.

The first insulating layer 120' may be an organic or inorganic layer. The organic layer may be formed of, but is not limited to, one selected from the group consisting of polyacrylates resin, epoxy resin, phenolic resin, polyamides resin, polyimides resin, unsaturated polyesters resin, poly(phenylene ethers) resin, poly(phenylene sulfides) resin and benzocyclobutene (BCB), and the inorganic layer may be formed of a silicon oxide layer, a silicon nitride layer or a silicon oxynitride layer.

The formation of the hole 120b in the first insulating layer 120' by removing the predetermined region of the first insulating layer 120' may be carried out through, but is not limited to, photolithography and etching processes known in the art.

Subsequently, referring to FIG. 6, according to the known layer forming method described above, a second insulating method 130 is formed on the first insulating layer 120' having the hole 120b.

The second insulating layer 130 may be formed of the same material as that for the first insulating layer 120'. To form the second insulating layer 130 by reflecting a profile of the hole 120b formed in the first insulating layer 120', the second insulating layer 130 may be an inorganic layer.

As shown in FIG. 6, the second insulating layer 130 is formed by reflecting the profile of the hole 120b, and thus includes a concave 130b formed in the hole 120b.

Here, the concave 130b formed in the second insulating layer 130 of the present invention is formed to correspond to the shape of a predetermined layer formed by the deposition apparatus according to the present invention.

For example, provided that a gate electrode is formed using the deposition apparatus according to the present invention, the shape of the concave 130b is formed to correspond to the shape of the gate electrode, or provided that an organic layer is formed using the deposition apparatus according to the present invention, the shape of the concave 130b is formed to correspond to the shape of the organic layer.

Here, the shape of the predetermined layer of the present invention may indicate a plan structure of the predetermined layer.

The second insulating layer 130 may be formed to a thickness of t4 as shown in FIG. 6, and formed to a thickness of t3 in the region in which the first and second insulating layers are formed, which will be described below.

Subsequently, referring to FIG. 7, a deposition material layer 140' is formed on the second insulating layer 130 having the concave 130b.

Meanwhile, while, in FIGS. 6 and 7, the second insulating layer 130 is formed on the first insulating layer 120' having the hole 120b, and the deposition material layer 140' is formed on the second insulating layer 130 having the concave 130b, the deposition material layer may be formed on the first insulating layer having the hole.

Figure 8:
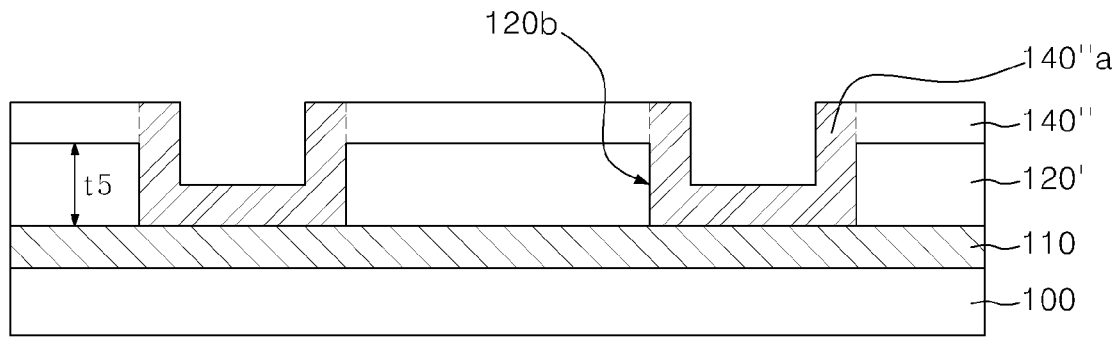
FIG. 8 is a schematic cross-sectional view of a deposition substrate of a deposition apparatus according to a third exemplary embodiment of the present invention.

FIG. 8 is a schematic cross-sectional view of a deposition substrate of a deposition apparatus according to a third exemplary embodiment of the present invention. Referring to FIG. 8, a deposition material layer 140" is formed on the first insulating layer 120' having the hole 120b, and the first insulating layer 120' has a thickness of t5. In the region in which the hole 120b is formed, the first insulating layer 120' is not formed, which will be described later.

Here, the hole 120b in the first insulating layer 120' in the present invention is formed to correspond to the shape of a predetermined layer formed by the deposition apparatus according to the present invention.

For example, provided that a gate electrode is formed using the deposition apparatus according to the present invention, the shape of the hole 120b is formed to correspond to the shape of the gate electrode, or provided that an organic layer is formed using the deposition apparatus according to the present invention, the shape of the hole 120b is formed to correspond to the shape of the organic layer.

Figure 9:
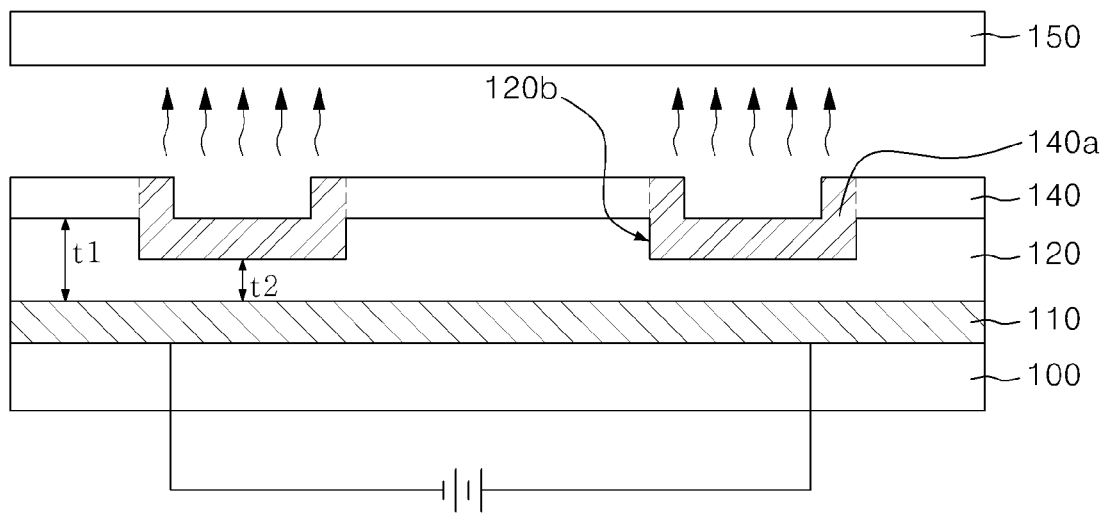
FIGS. 9 and 10 are schematic cross-sectional views illustrating a method of forming a layer using the deposition substrate according to the first exemplary embodiment of the present invention.
Figure 10:
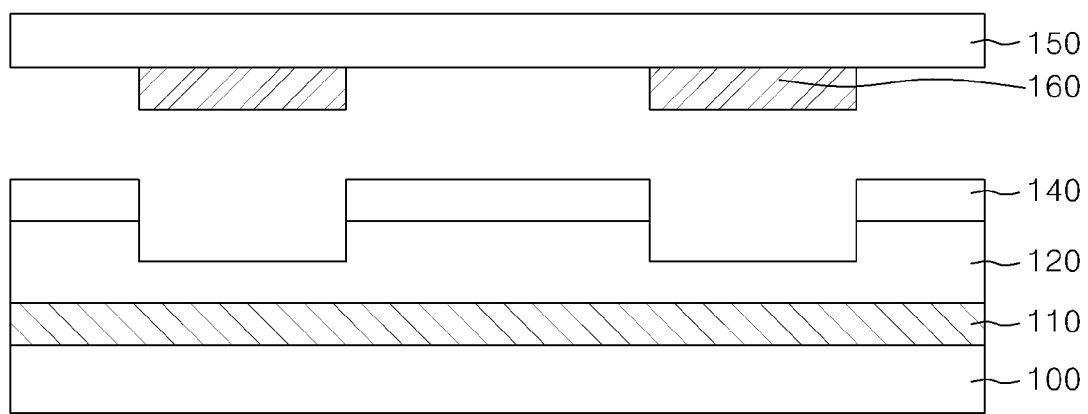

FIGS. 9 and 10 are schematic cross-sectional views illustrating a method of forming a layer using the deposition substrate according to the first exemplary embodiment of the present invention. Here, for clarity, in the accompanying drawings, configurations of a deposition substrate and a device substrate are merely illustrated, and the process of forming a layer may be performed in a vacuum chamber.

First, referring to FIG. 9, a deposition substrate according to the present invention is aligned to correspond to a device substrate 150.

Here, the deposition substrate, as described above, is formed by forming a heating conductive layer 110 for Joule heating on a substrate 100, forming an insulating layer 120 having a groove 120a on the heating conductive layer 110 for Joule heating, and forming a deposition material layer 140 on the insulating layer 120 having the groove.

Afterwards, an electric field is applied to the heating conductive layer 110 for Joule heating of the deposition substrate. The deposition material layer 140 is heated with Joule heat by applying the electric field to the heating conductive layer 110 for Joule heating.

Here, as described above, the insulating layer 120 is formed to a thickness of t1, and formed to a thickness of t2 in a region in which the groove 120a is formed.

In detail, in the region in which the groove 120a is formed, the thickness of the insulating layer is smaller than that of the insulating layer in the region in which the groove is not formed. Accordingly, the deposition material layer 140 heated with Joule heat due to the application of the electric field corresponds to a region 140a corresponding to the groove, and thus a deposition material in the region 140a corresponding to the groove is evaporated.

Subsequently, referring to FIG. 10, the evaporated deposition material is deposited on the device substrate 150 so as to form a predetermined layer 160.

The Joule heating refers to heating with heat generated due to a resistance generated while a current flows through a conductor. Energy per unit time applied to the conductive layer by Joule heating due to the application of an electric field may be represented by the following equation:

$$W = V \times I$$

In the equation, W is the energy per unit time by Joule heating, V is a voltage applied at both ends of the conductive layer, and I is a current.

According to the above equation, it can be seen that as a voltage (V) and/or a current (I) are increased, the energy per unit time applied to the conductive layer by Joule heating is also increased. When the conductive layer is increased in temperature due to Joule heating, thermal conduction to the deposition material layer occurs through the insulating layer disposed on the conductive layer, that is, the heating conductive layer for Joule heating. Further, due to the transferred heat, the deposition material in the region 140a corresponding to the groove may be evaporated.

Here, in the first exemplary embodiment of the present invention, the thermal conduction occurring from the heating conductive layer for Joule heating to the deposition material layer is controlled by the groove formed in the insulating layer. Due to the small thickness of the insulating layer, as described above, the thermal conduction to the deposition material layer occurs in the region in which the groove 120a is formed. However, the thermal conduction to the deposition material layer does not occur in the region in which the groove is not formed due to the large thickness of the insulating layer. Thus, the predetermined layer may be formed by evaporating the deposition material only in the region 140a corresponding to the groove.

The application of the electric field to the heating conductive layer 110a for Joule heating is carried out by applying energy of power density capable of generating high heat sufficient for inducing the evaporation in the region 140a corresponding to the groove. It is difficult to specify since the application of the electric field is determined by various factors including the resistance, length and thickness of the heating conductive layer 110 for Joule heating.

For smooth evaporation, however, the temperature applied to the region 120a corresponding to the groove may be at least 10° C. higher than a melting point of the deposition material and lower than a melting point of the heating conductive layer 110 for Joule heating. To this end, an electric field of about 1 to 1000 kw/cm$^2$ may be applied.

When the temperature is lower than the melting point of the deposition material, it may be difficult to evaporate the deposition material, and when the temperature exceeds the melting point of the heating conductive layer 110 for Joule heating, it may be difficult to deposit an exact pattern.

In other words, while the deposition material to be evaporated in the present invention has to be the deposition material in the region corresponding to the groove, when the temperature exceeds the melting point of the heating conductive layer for Joule heating, evaporation may also occur in the heating conductive layer for Joule heating. Thus, the composition, thickness and shape of the pattern to be formed in a layer are not uniform, and further the conductive layer may be destroyed.

Here, the applied current may be a direct or alternating current, and the time taken to apply the electric field may be $\frac{1}{1,000,000}$ to 100 seconds, preferably, $\frac{1}{1,000,000}$ to 10 seconds, and more preferably, $\frac{1}{1,000,000}$ to 1 second.

The application of the electric field may be repeated several times in a regular or irregular manner. Accordingly, the total thermal treatment time may be greater than the field application time, but is very short compared to the conventional layer forming methods.

In the formation of a thin film using the deposition apparatus including a deposition mask among the conventional layer forming methods, as a flat panel display device becomes larger, the deposition mask is also to be larger. At this time, due to sagging of the mask, it is difficult to align the mask with a subject and to manufacture a large-sized device. However, when the process of forming a layer is performed using the deposition substrate according to the present invention, although the flat panel display device is manufactured in a large size, due to the large thickness, the sagging cannot occur in the deposition substrate. As a result, the large-sized device can be obtained.

FIGS. 9 and 10 are schematic cross-sectional views illustrating a method of forming a layer using the deposition substrate according to the first exemplary embodiment of the present invention. However, the formation of a layer also can be performed using the deposition substrate according to the second exemplary embodiment.

As shown in FIG. 6, the second insulating layer 130 is formed by reflecting the profile of the hole 120b, and thus includes the concave 130b formed in the groove 120b. In addition, the second insulating layer 130 is formed to a thickness of t4, and formed to a thickness of t3 in the regions in which the first and second insulating layers are formed.

Here, the thickness of the second insulating layer in the region in which the concave 130b is formed is smaller than those of the first and second insulating layers in the region in which the concave 130b is not formed. Accordingly, the deposition material layer 140 heated with Joule heat due to the application of the electric field corresponds to a region 140'a corresponding to the concave 130b, and thus a deposition material in the region 140'a corresponding to the concave 130b is evaporated.

In detail, in the second exemplary embodiment of the present invention, thermal conduction occurring from the conductive layer for Joule heating to the deposition material layer is controlled by the concave formed in the second insulating layer. Due to the small thickness of the second insulating layer, as described above, the thermal conduction to the deposition material layer occurs in the region in which the concave is formed. The thermal conduction to the deposition material layer does not occur in the region in which the concave is not formed due to the large thicknesses of the first and second insulating layers. Thus, a predetermined layer may be formed by evaporating the deposition material only in the region 140'a corresponding to the concave.

The formation of a layer can be performed using a deposition substrate according to a third exemplary embodiment by the same principle as described above.

As shown in FIG. 8, a first insulating layer 120' is formed to a thickness of t5. However, a insulating layer is not formed in the region in which the hole 120b is formed.

In detail, the region in which the hole 120b is formed does not have the insulating layer, but the region in which the hole 120b is not formed has the first insulating layer. Accordingly, a deposition material layer 140'' heated with Joule heat due to the application of the electric field corresponds to a region 140''a corresponding to the hole 120b, and the deposition material of the region 140''a corresponding to the hole 120b is evaporated.

Consequently, in the third exemplary embodiment of the present invention, thermal conduction from the heating conductive layer for Joule heating to the deposition material layer is controlled by the hole 120b in the first insulating layer.

Figure 11:
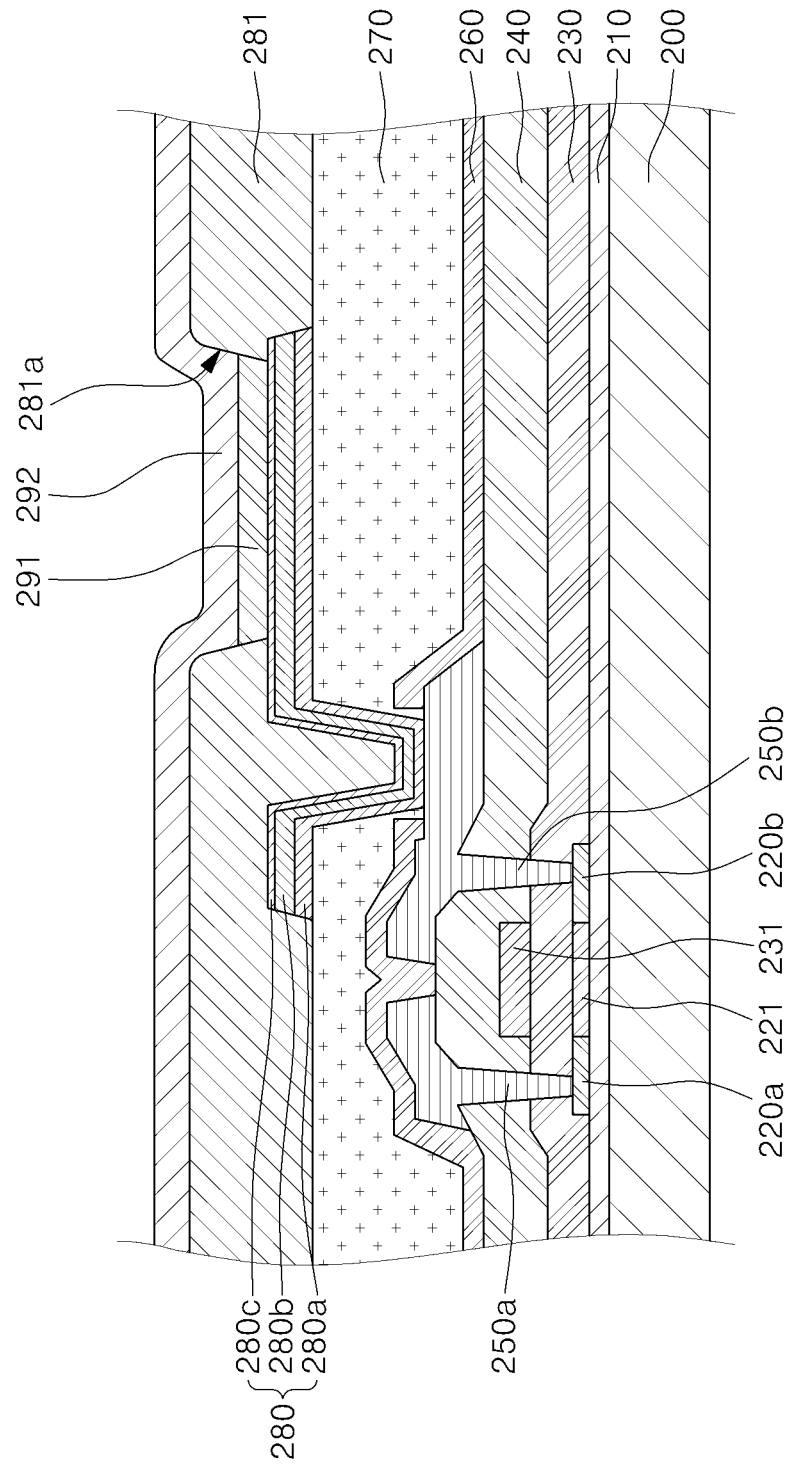
FIG. 11 is a cross-sectional view of an organic light emitting diode (OLED) display device having a general structure.

FIG. 11 is a cross-sectional view of an organic light emitting diode (OLED) display device having a general structure.

Referring to FIG. 11, a buffer layer 210 is formed on the entire surface of a transparent insulating substrate 200 to have a predetermined thickness using silicon oxide through PECVD. Here, the buffer layer 210 serves to prevent out-diffusion of impurities from the transparent insulating substrate 200 in crystallization of an amorphous silicon layer to be formed in a subsequent process.

A semiconductor layer, an amorphous silicon layer (not shown), is deposited on the buffer layer 210 to have a predetermined thickness. Subsequently, the amorphous silicon layer is crystallized through excimer laser annealing (ELA), sequential lateral solidification (SLS), metal induced crystallization (MIC) or metal induced lateral crystallization (MILC), and patterned through photolithography and etching processes, thereby forming a semiconductor layer pattern in a unit pixel.

A gate insulating layer 230 is formed on the entire surface of the substrate including the semiconductor layer pattern. Here, the gate insulating layer 230 may be formed of silicon oxide layer ($SiO_2$), silicon nitride layer (SiNx) or a combination thereof.

A gate electrode 231 is formed in a predetermined region corresponding to a channel region 221 of the semiconductor layer pattern on the gate insulating layer 230. The gate electrode 231 may be formed of one selected from the group consisting of aluminum (Al), an Al alloy, molybdenum (Mo) and a Mo alloy.

Impurity ions are implanted into the semiconductor layer pattern 220 using the gate electrode 231 as an ion implantation mask so as to form source and drain regions 220a and 220b. Here, the ion implantation process is performed using n+- or p+-type impurities as dopants.

An interlayer insulating layer 240 is formed on the entire surface to have a predetermined thickness. Here, the interlayer insulating layer 240 may be a silicon oxide layer ($SiO_2$), a silicon nitride layer (SiNx) or a combination thereof.

Afterwards, the interlayer insulating layer 240 and the gate insulating layer 230 are etched through photolithography and etching processes to form a contact hole exposing the source and drain regions 220a and 220b.

Subsequently, source and drain electrodes 250a and 250b in contact with the source and drain regions 220a and 220b are formed. Here, in the formation of the source and drain electrodes 250a and 250b, the source and drain electrodes are formed in a single layer structure of one selected from the group consisting of Mo, W, MoW, AlNd, Ti, Al, an Al alloy, Ag and an Ag alloy, or in a double- or multi-layered structure of low-resistance materials such as Mo, Al and Ag to reduce an interconnection resistance, that is, in a stacked structure of one selected from the group consisting of Mo/Al/Mo, MoW/AlNd/MoW, Ti/Al/Ti, Mo/Ag/Mo and Mo/Ag alloy/Mo.

An insulating layer may be disposed on top surfaces of the source and drain electrodes 250a and 250b, and be an inorganic layer 260, an organic layer 270 or a combination thereof. Further, a first electrode layer 280 connected with the insulating layer through a via hole formed in the insulating layer is disposed on the insulating layer.

The first electrode layer 280 may be formed of a transparent electrode in the case of a bottom-emission device, and a reflective electrode in the case of a top-emission device. The first electrode layer may be formed of one selected from the group consisting of indium tin oxide (ITO), indium zinc oxide (IZO), tin oxide (TO), and zinc oxide (ZnO) when the first electrode layer 280 is used as a transparent electrode, whereas the first electrode layer may be formed by stacking a reflective layer of one selected from the group consisting of Ag, Mg, Al, Pt, Pd, Au, Ni, Nd, Ir, Cr and a combination thereof, and a transparent electrode of one selected from the group consisting of ITO, IZO, TO and ZnO when the first electrode layer 280 is used as a reflective electrode.

The first electrode layer 280 may be formed in a stacked structure of a lower electrode layer 280a, a reflective electrode layer 280b and an upper electrode layer 280c in the case of the top-emission device.

The lower electrode layer 280a may be formed of one selected from the group consisting of ITO, IZO, TO and ZnO. Here, the lower electrode layer 280a is formed to a thickness of 50 to 100 Å. When the thickness of the lower electrode layer 280a is less than 50 Å, it is difficult to ensure uniformity, whereas when the thickness of the lower electrode layer 280a is more than 100 Å, adhesive strength is decreased due to stress of the lower electrode layer itself.

The reflective electrode layer 280b may be formed of one selected from the group consisting of Al, an Al alloy, Ag and an Ag alloy. Here, the reflective electrode layer 280b may be formed to a thickness of 900 to 2000 Å. When the thickness of the reflective electrode layer 280b is less than 900 Å, some of light is transmitted through the layer, whereas when the thickness of reflective electrode layer 280b is more than 2000 Å, it is not advantageous in terms of production cost or processing time.

Here, the reflective electrode layer 280b serves to reflect light and thus increases brightness and luminous efficiency.

The upper electrode layer 280c may be formed of one selected from the group consisting of ITO, IZO, TO and ZnO. Here, the upper electrode layer 280c is formed to a thickness of 50 to 100 Å. When the thickness of the upper electrode layer 280c is less than 50 Å, it cannot ensure the uniformity of a thin film, and when the thickness of the upper electrode layer 280 is more than 100 Å, reflectivity in a blue light region is decreased by 10 to 15% due to an interference effect.

Subsequently, an insulating layer is formed on the first electrode layer 280. Here, the insulating layer may be a pixel defining layer 281.

The pixel defining layer 281 may be formed of one selected from the group consisting of polyacrylates resin, epoxy resin, phenolic resin, polyamides resin, polyimides resin, unsaturated polyesters resin, poly(phenylene ethers) resin, poly(phenylene sulfides) resin and benzocyclobutene (BCB).

Here, the pixel defining layer 281 includes an opening 281*a* partially exposing the first electrode layer.

Subsequently, an organic layer 291 including an emitting layer is disposed on the first electrode layer exposed by the opening 281*a*, and a second electrode 292 is then formed on the organic layer 291.

Specifically, the organic layer 291 includes an emitting layer, and may further include at least one of a hole injection layer, a hole transport layer, an electron transport layer and an electron injection layer. However, in the present invention, the configuration and material of the organic layer are not limited.

As a material for the hole transport layer, N,N'-di(naphthalene-1-yl)-N, N'-diphenyl-benzidine (α-NPB) or N,N'-bis(3-methylphenyl)-N,N'-diphenyl-[1,1'-biphenyl]-4,4'-diamine (TPD) may be used. The hole transport layer may be formed to a thickness of 10 to 50 nm. When the thickness of the hole transport layer is beyond the above range, a hole injection characteristic is decreased.

In addition to the hole transport material, a dopant capable of emitting light when electron-hole combination occurs may be added to the hole transport layer. The dopant may be 4-(dicyanomethylene)-2-tert-butyl-6-(1,1,7,7-tetramethyljulolidyl-9-enyl)-4H-pyran(4-(dicyanomethylene)-2-t-butyl-6-(1,1,7,7-tetramethyljulolidyl-9-enyl)-4H-pyran (DCJTB), coumarin 6, rubrene, DCM, DCJTB, perylene, or quinacridone. The content of the dopant is 0.1 to 5 wt % of the total weight of the material for the hole transport layer. Accordingly, when the dopant is added during the formation of the hole transport layer, the color of the emitted light can be controlled according to the kind and content of the dopant, and the hole transport layer is enhanced in thermal stability, resulting in improvement in lifespan of the device.

The hole injection layer may be formed of a starbustamine-based compound to have a thickness of 30 to 100 nm. When the thickness of the hole injection layer is beyond the above range, a hole injection characteristic is decreased. Through the hole injection layer, the contact resistance between a counter electrode and a hole transport layer is reduced and the hole transport capability of an anode electrode is enhanced. Further, the addition of the hole injection layer improves entire characteristics of the device.

A material for an emitting layer is not particularly limited, and, for example, the material may be 4,4'-bis(carbazol-9-yl)-biphenyl (CBP).

The emitting layer may further contain a dopant capable of emitting light when the electron-hole combination occurs like the hole transport layer. Here, the kind and content of the dopant may be almost the same as those of the hole transport layer and have a thickness of 10 to 40 nm.

As a material for the electron transport layer, tris(8-quinolinate)-aluminum (Alq 3) or Almq 3 is used, and a dopant capable of emitting light when the electron-hole combination occurs may also be included therein like the hole transport layer. Here, the kind and content of the dopant are almost the same as those of the hole transport layer and have a thickness of 30 to 100 nm. When the thickness of the electron transport layer is beyond the above range, efficiency is decreased, and a driving voltage is increased.

A hole blocking layer may be further formed between the emitting layer and the electron transport layer. Here, the hole blocking layer serves to prevent the transport of excitons generated from a phosphorus light emitting material to the electron transport layer or prevent the transport of holes to the electron transport layer. Accordingly, the hole blocking layer may be formed of BAlq.

The electrode injection layer may be formed of a material composed of LiF at a thickness of 0.1 to 10 nm. When the thickness of the electron injection layer is beyond the above range, the driving voltage can be increased.

The second electrode 292 formed on the top surface of the organic layer may be a reflective type and formed of one selected from the group consisting of Li, Ca, LiF/Ca, LiF/Al, Al, Mg and alloys thereof in the case of the bottom-emission device.

In the case of the top-emission device, the second electrode 292 formed on the top surface of the organic layer may be a semi-transparent cathode-type electrode or may be formed in a stacked structure in which a semi-transparent cathode is formed and then a transparent cathode-type electrode is stacked thereon. The semi-transparent cathode-type electrode may be formed of one selected from the group consisting of Li, Ca, LiF/Ca, LiF/Al, Al, Mg and an Mg alloy to have a small thickness of 5 to 30 nm. The method of forming the stacked structure includes forming a semi-transparent cathode using a metal having a small work function, that is, one selected from the group consisting of Li, Ca, LiF/Ca, LiF/Al, Al, Mg and an Mg alloy, and forming a layer of ITO or IZO having a low-resistance characteristic. Here, when the thickness of the semi-transparent cathode is less than 5 nm, electrons cannot be injected at a low voltage, and when the thickness of the semi-transparent cathode is more than 30 nm, transmissivity is significantly decreased. The total thickness of the semi-transparent cathode and the transparent cathode is preferably 10 to 400 nm.

Figure 12:
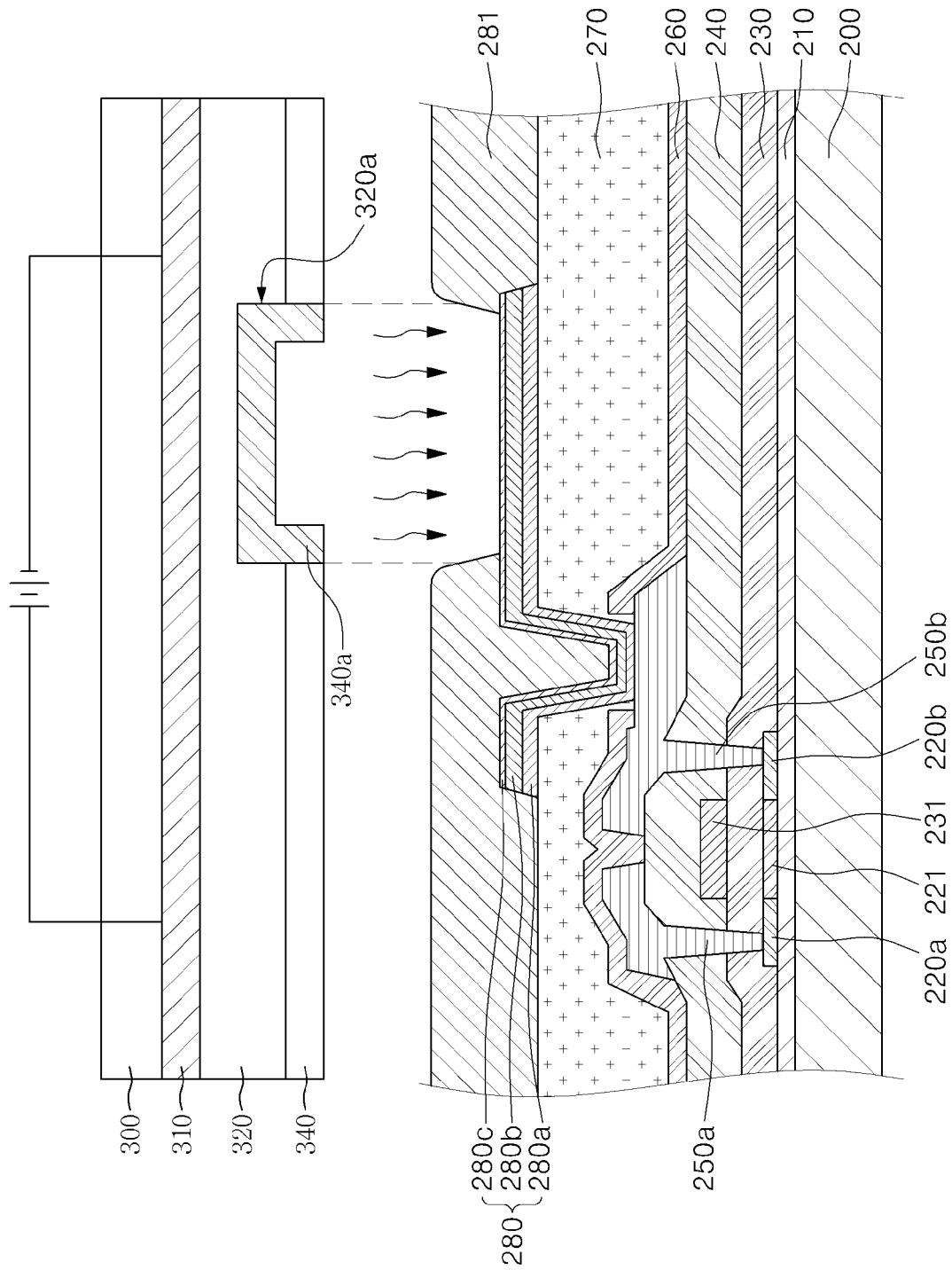
FIGS. 12 and 13 are schematic cross-sectional views illustrating a process of forming an organic layer of the OLED display device of FIG. 11 using the deposition substrate according to the first exemplary embodiment of the present invention.
Figure 13:
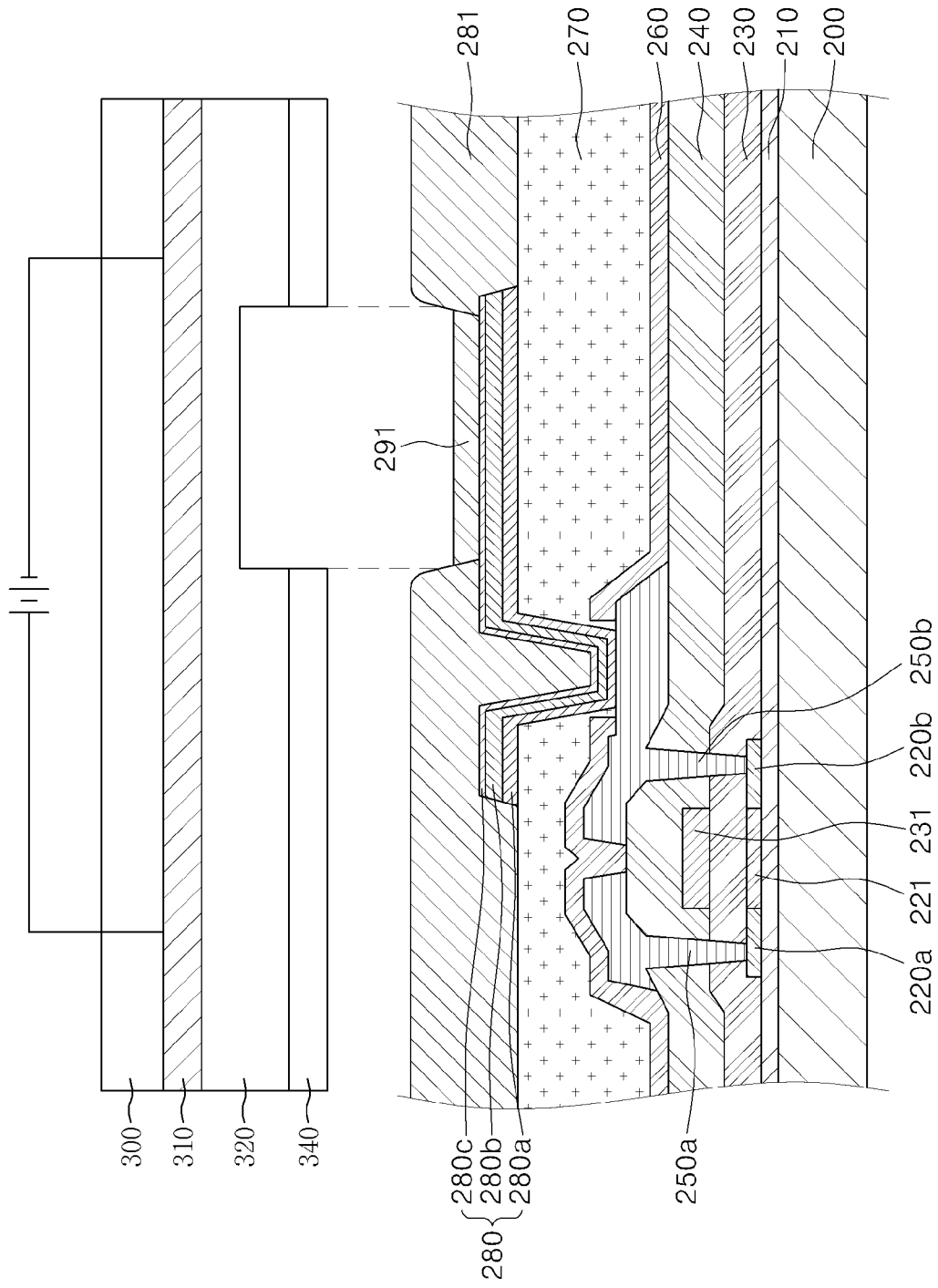

FIGS. 12 and 13 are schematic cross-sectional views illustrating a process of forming an organic layer of the OLED display device of FIG. 11 using the deposition substrate according to the first exemplary embodiment of the present invention.

Referring to FIG. 12, a heating conductive layer 310 for Joule heating is formed on a substrate 300, an insulating layer 320 including a groove 340*a* is formed on the heating conductive layer 310 for Joule heating, and an electric field is applied to the heating conductive layer 310 for Joule heating of a deposition substrate having a deposition material layer 340 formed on the insulating layer 320 having the groove.

Here, since an organic layer of the OLED display device of FIG. 11 is formed using the deposition substrate according to the present invention, the shape of the groove 320*a* is patterned to correspond to the shape of the organic layer.

The deposition material layer 340 is formed of a material for the organic layer.

As described above, the organic layer may include an emitting layer, and further include at least one of a hole injection layer, a hole transport layer, an electron transport layer and an electron injection layer. For example, when the emitting layer is formed, the shape of the groove 320*a* is formed to correspond to the shape of the emitting layer, and the deposition material layer 340 is formed of the material for the emitting layer.

Here, the deposition material layer 340 heated with Joule heat by the application of the electric field corresponds to the region 340*a* corresponding to the groove, and thus a deposition material in the region 340*a* corresponding to the groove is evaporated.

Subsequently, referring to FIG. 13, the evaporated deposition material is deposited on the first electrode layer exposed by an opening formed in the pixel defining layer 281 so as to form the organic layer.

While, in FIGS. 12 and 13, the process of forming the organic layer of FIG. 11 is merely illustrated, the gate electrode 231, the source and drain electrodes 250a and 250b, or the first electrode layer 280 of FIG. 11 may also be formed by the same method as described above.

For example, when the gate electrode 231 is formed, the shape of the groove is patterned to correspond to the shape of the gate electrode, and the deposition material layer 340 is formed a material for the gate electrode.

When the source and drain electrode 250a and 250b are formed, the shape of the groove is patterned to correspond to the shape of the source and drain electrodes, and the deposition material layer 340 is formed of a material for the source and drain electrodes.

When the first electrode layer 280 is formed, the shape of the groove is patterned to correspond to the shape of the first electrode layer, and the deposition material layer 340 is formed of a material for the first electrode layer.

While the invention has been shown and described with reference to certain exemplary embodiments thereof, it will be understood by those skilled in the art that various changes in form and details may be made therein without departing from the spirit and scope of the invention as defined by the appended claims.

The invention claimed is:

1. A deposition substrate of a deposition apparatus, comprising:
a substrate;
a heating conductive layer formed on the substrate, the heating conductive layer generating Joule-heat when applying an electric field thereto;
a first insulating layer formed on the heating conductive layer and including a groove or a hole, wherein the heating conductive layer is disposed under the first insulating layer and contacts directly with the first insulating layer; and
a deposition material layer formed on the first insulating layer.

2. The substrate according to claim 1, wherein the substrate is formed of glass, ceramic or plastic.

3. The substrate according to claim 1, wherein the heating conductive layer is formed of a metal or metal alloy.

4. The substrate according to claim 1, wherein the deposition material layer includes a concave, and the concave has a conformal shape to the groove or the hole.

5. The substrate according to claim 1, wherein the deposition material layer is an organic layer, an inorganic layer or a metal layer.

6. The substrate according to claim 1, further comprising a second insulating layer formed between the first insulating layer and the deposition material layer, wherein the second insulating layer includes a concave.

7. The substrate according to claim 6, wherein the concave is formed to correspond to the shape of the groove or the hole.

8. A method of forming a layer, comprising:
preparing a substrate;
forming a heating conductive layer on the substrate;
forming a first insulating layer on the heating conductive layer and including a groove or a hole, wherein the heating conductive layer is disposed under the first insulating layer and contacts directly with the first insulating layer;
forming a deposition material layer on the first insulating layer; and
applying an electric field to the heating conductive layer to perform Joule heating on the deposition material layer.

9. The method according to claim 8, wherein the first insulating layer has a concave having a conformal shape to the groove or the hole.

10. The method according to claim 8, wherein the deposition material layer subjected to the Joule heating is the deposition material layer in a region corresponding to the groove or the hole.

11. The method according to claim 10, wherein a deposition material of the deposition material layer in the region corresponding to the groove or the hole is evaporated.

12. The method according to claim 8, wherein the electric field is applied in such a way that a deposition material of the deposition material layer in the region corresponding to the groove or the hole has a temperature of 10° C. more than a melting point of the deposition material and less than a melting point of the heating conductive layer.

13. The method according to claim 8, wherein an electric field of 1 to 1000 kw/cm² is applied to the heating conductive layer.

14. The method according to claim 8, wherein the electric field is applied for 1/1,000,000 to 100 seconds.

15. The method according to claim 8, wherein the electric field is applied for 1/1,000,000 to 1 second.

16. The method according to claim 8, further comprising forming a second insulating layer having a concave after forming the first insulating layer and before forming the deposition material layer.

17. The method according to claim 16, wherein the concave has a conformal shape to the groove and the hole.

18. A method of manufacturing an organic light emitting diode (OLED) display device, comprising:
preparing a first substrate;
forming a first electrode layer on a top surface of the first substrate;
forming a pixel defining layer on a top surface of the first electrode layer;
forming an opening partially exposing the first electrode layer on the pixel defining layer;
forming an organic layer including an emitting layer on a top surface of the first electrode layer; and
forming a second electrode layer on a top surface of the organic layer,
wherein at least one layer of the OLED display device is formed by:
preparing a second substrate corresponding to the first substrate;
forming a first heating conductive layer on the second substrate;
forming a first insulating layer having a first groove or a first hole on the first heating conductive layer, wherein the first heating conductive layer is under the first insulating layer and contacts directly with the first insulating layer;
forming a first deposition material layer on the first insulating layer; and
applying an electric field to the first heating conductive layer to perform Joule heating on the first deposition material layer.

19. The method according to claim 18, further comprising forming a thin film transistor including: a semiconductor layer including a channel region and source and drain regions on the first substrate; a gate electrode corresponding to the channel region of the semiconductor layer; and source and drain electrodes in electrical connection with the semiconductor layer, wherein the gate electrode or the source or drain electrode of the thin film transistor is formed by:

preparing a third substrate corresponding to the first substrate;

forming a second heating conductive layer on the third substrate;

forming a second insulating layer having a second groove or a second hole on the second heating conductive layer;

forming a second deposition material layer on the second insulating layer; and applying an electric field to the second heating conductive layer to perform Joule heating on the second deposition material layer.

20. The method according to claim 19, wherein the second hole or the second groove is formed to correspond to a shape of the gate electrode, and the second deposition material layer is formed of a material for the gate electrode.

21. The method according to claim 19, wherein the second hole or the second groove is formed to correspond to a shape of the source or drain electrode, and the second deposition material layer is formed of a material for the source or drain electrode.

22. The method according to claim 18, wherein the first deposition material layer subjected to the Joule heating is a deposition material layer in a region corresponding to the first groove or the first hole.

23. The method according to claim 18, wherein a deposition material of the first deposition material layer in the region corresponding to the first groove or the first hole is evaporated.

24. The method according to claim 18, wherein the electric field is applied in such a way that a deposition material of the first deposition material layer in the region corresponding to the first groove or the first hole has a temperature of 10° C. more than a melting point of the deposition material and is less than a melting point of the first heating conductive layer.

25. The method according to claim 18, wherein an electric field of 1 to 1000 kw/cm$^2$ is applied to the first heating conductive layer.

26. The method according to claim 18, further comprising forming a second insulating layer having a concave after forming the first insulating layer and before forming the first deposition material layer.

27. The method according to claim 26, wherein the concave has a conformal shape to the first groove or the first hole.

28. The method according to claim 18, wherein the first hole or the first groove is formed to correspond to a shape of the organic layer, and the first deposition material layer is formed of a material for the organic layer.

29. The method according to claim 18, wherein the first hole or the first groove is formed to correspond to a shape of the first electrode layer, and the first deposition material layer is formed of a material for the at least one layer of the OLED display device.

* * * * *